(12) United States Patent
Hoshino

(10) Patent No.: US 8,445,095 B2
(45) Date of Patent: May 21, 2013

(54) HOT-PRESS SHEET

(75) Inventor: Shigeo Hoshino, Kanuma (JP)

(73) Assignee: Yamauchi Corporation, Osaka (JP)

( * ) Notice: Subject to any disclaimer, the term of this patent is extended or adjusted under 35 U.S.C. 154(b) by 2203 days.

(21) Appl. No.: 10/558,038

(22) PCT Filed: May 13, 2004

(86) PCT No.: PCT/JP2004/006443
§ 371 (c)(1),
(2), (4) Date: Nov. 23, 2005

(87) PCT Pub. No.: WO2004/103691
PCT Pub. Date: Dec. 2, 2004

(65) Prior Publication Data
US 2006/0292346 A1    Dec. 28, 2006

(30) Foreign Application Priority Data

May 26, 2003  (JP) .................................. 2003-147667

(51) Int. Cl.
*D06N 7/04*    (2006.01)
(52) U.S. Cl.
USPC ............................ 428/141; 428/143; 428/153
(58) Field of Classification Search
USPC ................................... 428/141, 142, 147, 148
See application file for complete search history.

(56) References Cited

U.S. PATENT DOCUMENTS

| | | | |
|---|---|---|---|
| 4,690,845 A | 9/1987 | Kloss, Jr. | |
| 6,514,888 B1 | 2/2003 | Tanaka et al. | |
| 2002/0079053 A1 | 6/2002 | Tanaka et al. | |
| 2003/0143407 A1 * | 7/2003 | Yamasaki et al. | 428/447 |

FOREIGN PATENT DOCUMENTS

| | | |
|---|---|---|
| CN | 1135379 A | 11/1996 |
| CN | 200480014001.6 | 3/2007 |
| JP | 2076700 U | 6/1990 |
| JP | 6322326 | 11/1994 |
| JP | 9182998 | 7/1997 |
| JP | 3062091 U | 6/1999 |

OTHER PUBLICATIONS

Machine English Translation: Yoshida JP 09-182998 (1997).*
Machine English Translation: Nakamoto et al. JP 08-207199 (1996).*
Supplementary European Search Report for related European Patent Application No. EP 04 73 2752 dated Feb. 20, 2012, pp. 1-3.

* cited by examiner

*Primary Examiner* — Mark Ruthkosky
*Assistant Examiner* — Linda N. Chau
(74) *Attorney, Agent, or Firm* — Ditthavong Mori & Steiner, P.C.

(57) ABSTRACT

A hot-press sheet (20) comprises a sheet-shaped base material (1) and a release coating film (2) applied to a surface of the base material (1), in which the coating film (2) completely covers an entire surface of the base material (1) to provide air-tightness for the hot-press sheet (20). The coating film (2) comprises a resin composition as a host material, and 5% or more by weight of organic powder and 5% or more by weight of inorganic powder are mixed in 100% by weight of the resin composition which forms the coating film (2), so that the mixture of 5 to 55% by weight of the organic powder and 5 to 55% by weight of the inorganic powder becomes 30 to 60% by weight in total.

2 Claims, 4 Drawing Sheets

F I G. 1 0
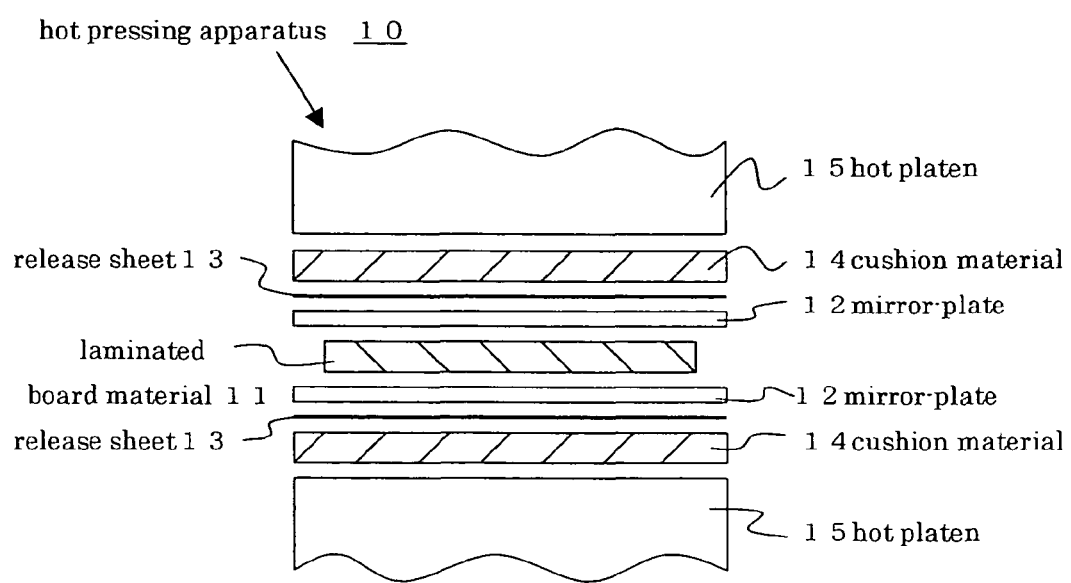

HOT-PRESS SHEET

TECHNICAL FIELD

The present invention relates to a hot-press sheet used as a release sheet or a cushion material when an object product is hot pressed or thermally compression bonded, in a process of manufacturing a precision equipment component having a laminated structure (referred to as the laminated board hereinafter) such as a printed circuit board such as a copper-clad laminated board, a flexible printed circuit board (FPC) and a multi-layer laminated board, an IC card, a ceramics laminated board, a liquid crystal display panel and the like. Particularly, the present invention relates to an improvement of a surface material of a hot-press sheet.

BACKGROUND ART

In general, in the process of hot pressing or thermal compression bonding in manufacturing the laminated board, as shown in FIG. 10, the following method is used, that is, a mirror-plate 12 is put on upper and lower surfaces of a laminated board 11 which is an object, and a release sheet 13 and a cushion material 14 are interposed on upper and lower surfaces of the mirror-plate 12 so as to be sandwiched by hot platens 15, and pressure and heat are applied thereto. In order to provide the laminated board with high precision, it is necessary to uniformly apply the pressure and heat over an entire surface of the laminated board material 11.

Thus, the cushion material 14 carries out a function of reducing unevenness of heat and pressure of the hot platen 15 so that the pressure and heat can be applied uniformly over the entire surface. As the cushion material 14, various kinds of materials such as kraft paper, organic fibers or inorganic fibers combined by a binder, a rubber, non-woven fabric, a laminated material of rubber and non-woven fabric and the like are used. When the cushion material 14 is made of a fibrous material, bits of fibers are separated from the cushion material 14 in some cases. When the bits of fibers are attached on the laminated board material 11 or the mirror-plate 12, which causes dents or scars on the laminated board material 11.

When the cushion material 14 is made of a material having a low release property, the cushion material 14 sticks to the mirror-plate 12 in some cases. Thus, the release sheet 13 carries out a function of preventing the bits of the fibers from being separated from the cushion material 14 and floating, and a function of preventing the cushion material 14 from sticking to the mirror-plate 12. Meanwhile, when the surface of the cushion material 14 itself has a release property, the release sheet may not be used. According to the present invention, a term of the hot-press sheet means it includes both release sheet 13 and cushion material 14.

As a conventional hot-press release sheet, a sheet formed of a single synthetic resin film or a sheet formed of a composite material comprising a sheet-shaped base material and a release coating film formed on the base material are known. Japanese Unexamined Patent Publication No. 9-182998 (patent document 1) is a well-known document about a release sheet comprising a composite material. According to the patent document 1, the release sheet comprises a base material layer and a release layer formed on a surface of the base material layer, and the release layer is formed of a heat-resistant release coating or a heat-resistant release film.

Japanese Unexamined Patent Publication No. 6-322326 (patent document 2) is a well-known document about improvement of a release surface material of a cushion material. The patent document 2 discloses a cushion material in which a heat-sensitive adhesive sheet is provided by applying an unvulcanized fluoro rubber to one surface (back surface) of a sheet-shaped base material and by applying heat-resistant coating to the other surface (front surface) thereof and laminated in such a manner that the unvulcanized fluoro rubber surface may be in contact with an object, and they are bonded so as to be integrated.

Each of the release sheet described in the patent document 1 and the cushion material described in the patent document 2 comprises the sheet-shaped base material and the release coating film comprising the heat-resistant coating formed on the base material.

According to the conventional hot-press sheet, when the heat-resistant coating was applied onto the surface of the base material and dried, thin parts called sinks or dents were likely to be generated in the coating film. These sinks or dents mean a phenomenon in which a few thin parts having a diameter about 1 mm are generated in the hot-press sheet per 1 $m^2$ and it was difficult to eliminate these sinks or dents. The hot-press sheet needs to have durability in which it can be used in pressing processes several hundred of times. If the hot-press sheet has the sinks or dents, while it is repeatedly used, a crack caused by the sink or dent is generated or the base material at the sink or the dent is exposed because of abrasion of the surface, which lowers the durability. In addition, when the hot-press sheet having the sinks or dents on the surface is bent at the time of handling such as transporting, a crack is likely to be generated because of the sink or dent.

The inventors of the present invention confirmed in the experiments that when a powder filler was mixed in the heat-resistant coating, the sink or dent could be effectively prevented. However, it was found also that when the powder filler was mixed in a normal way, general requirement characteristics for the hot-press sheet such as abrasion resistance, release property, flexibility, coating workability of the coating film were likely to deteriorate, so that it is a new issue to prevent the sink or dent without lowering the above requirement characteristics.

DISCLOSURE OF INVENTION

Thus, it is an object of the present invention to provide a hot-press sheet in which sinks or dents are prevented from being generated in a surface of a release coating film, and abrasion resistance, release property, flexibility, and coating workability of the coating film are satisfactorily provided.

According to a hot-press sheet of the present invention comprises a sheet-shaped base material and a release coating film formed on the base material, in which the coating film comprises a resin composition in which 5 to 55% by weight of organic powder and 5 to 55% by weight of inorganic powder are mixed in 100% by weight of the resin composition so that the mixture of the organic powder and the inorganic powder becomes 30 to 60% by weight in total.

When 30 to 60% by weight of the mixture of the organic powder and the inorganic powder is mixed in the resin composition which forms the coating film, the sinks or the dents are prevented from being generated. When the total mixture ratio of the organic powder and the inorganic powder is less than 30% by weight, the sinks or dents are likely to be generated. Meanwhile, the total mixture ratio of the organic powder and inorganic powder is more than 60% by weight, flexibility of the coating film is lowered so that a crack is likely to be generated and viscosity of the coating fluid is increased so that its coating workability becomes worse. The total mixture ratio of the organic powder and the inorganic powder is preferably 35 to 50% by weight.

Even when the mixture ratio of the organic powder and the inorganic powder is 30 to 60% by weight in total, if the mixture ratio of the organic powder is less than 5% by weight, the abrasion resistance and the flexibility of the coating film deteriorate. The mixture ratio of the organic powder in 100% by weight of the resin composition is preferably not less than 10% by weight, and further preferably not less than 15% by weight.

Furthermore, even when the mixture ratio of the organic powder and inorganic powder is 30 to 60% by weight in total, if the mixture ratio of the inorganic powder is less than 5% by weight, the release property of the coating film deteriorates. The mixture ratio of the inorganic powder in 100% by weight of the resin composition is preferably not less than 10% by weight, and further preferably not less than 15% by weight.

When the mixture ratio of either one of organic powder or inorganic powder is more than 55% by weight, it exceeds an upper limit of the condition that the mixture ratio of the organic powder and inorganic powder is 30 to 60% by weight in total.

Preferably, the mixture ratio of the organic powder to the inorganic powder is 2:5 to 5:2. When the mixture ratio of the organic powder to the inorganic powder is less than 2:5, the abrasion resistance and the flexibility of the coating film could deteriorate, and when the mixture ratio of the organic powder to the inorganic powder is more than 5:2, the release property of the coating film could deteriorate.

Preferably, an average particle diameter of the organic powder and the inorganic powder is 0.1 to 10.0 μm.

The base material preferably has irregularities over an entire surface and the irregularities appear on a surface of the coating film. When the irregularities of the base material appear on the surface of the coating film, the release property of the hot-press sheet is improved.

In addition, the base material may have a single-layer structure or a laminated-layer structure.

BRIEF DESCRIPTION OF DRAWINGS

FIG. 10 is a view for explaining a hot pressing apparatus.

BEST MODE FOR CARRYING OUT THE INVENTION

Hereinafter, embodiments of the present invention will be described.

Figure 1:
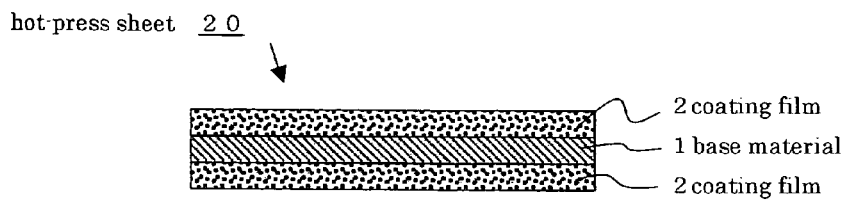
FIG. 1 is a sectional view showing a general constitution of a hot-press sheet according to the present invention.

FIG. 1 shows a hot-press sheet 20 according to the present invention. The hot-press sheet 20 comprises a sheet-shaped base material 1 and a release coating film 2 applied on a surface of the base material 1. The coating film 2 covers the entire surface of the base material 1 completely so that airtightness is provided in the hot-press sheet 20. Since the hot-press sheet 20 is airtight, when the hot-press sheet 20 is handled in the vicinity of a hot press apparatus, it can be transported by suction.

The coating film 2 comprises a resin composition as a host material and organic powder and inorganic powder need to be mixed in the resin composition. In addition, as described above, 5% or more by weight of the organic powder and 5% or more by weight of the inorganic powder are mixed in 100% by weight of the resin composition which constitutes the coating film and the total mixed amount of the organic powder and the inorganic powder needs to be 30 to 60% by weight.

Preferably, a mixture ratio of the organic powder and the inorganic powder is 2:5 to 5:2. If the mixture ratio of the organic powder to the inorganic powder is less than 2:5, abrasion resistance and flexibility of the coating film could deteriorate. Meanwhile, the mixture ratio of the organic powder to the inorganic powder is more than 5:2, the release property of the coating film could deteriorate. More preferably, the mixture ratio of the organic powder to the inorganic powder is 3:5 to 5:3.

As the host material in the resin composition constituting the coating film 2, a heat-resistant resin such as a fluoro resin, a phenol resin, a melamine resin, an epoxy resin, an unsaturated polyester resin, a silicone resin, a polyimide resin, a thermosetting acrylic resin, a furan resin, a urea resin, a diallyl phthalate resin, a polyurethane resin and the like is used as a single, a blend or a copolymer. Especially, the polyimide resin and the fluoro resin are preferable.

As the organic powder mixed in the resin composition which constitutes the coating film 2, although the powder comprising the same heat-resistant resin as shown above as the host material can be used, the fluoro resin powder is preferably used. In addition, the organic powder has preferably has an average particle diameter 0.1 μm to 10.0 μm.

Although the kind of the inorganic powder mixed in the resin composition which constitutes the coating film 2 is not limited especially, there are carbon, aluminum, titanium oxide, zinc oxide, iron oxide and the like. An average particle diameter of the inorganic powder is preferably 0.1 μm to 10.0 μm.

The coating film is applied to the base material 1 by a well-known method such as blade coating, knife coating, cast coating and the like.

In order to improve an adhesive property of the coating film 2, the base material 1 preferably has irregularities. In this sense, the base material 1 is preferably provided with a material selected from woven fabric, non-woven fabric, and paper comprising heat-resistant organic fibers or inorganic fibers on its surface. Since the base material 1 which comprises the material selected from the woven fabric, the non-woven fabric and the paper has irregularities provided by texture of the woven fabric or fibers of the non-woven fabric or the paper on its entire surface, the adhesive property of the coating film 2 is satisfactorily provided.

In addition, the irregularities of the base material 1 preferably appear on the surface. When the irregularities of the base material 1 appear on the surface of the coating film 2, the release property of the hot-press sheet 20 is improved. In order to improve the release property of the hot-press sheet 20, surface roughness of the coating film 2 (Ra: arithmetic average roughness defined by JIS-B0601) is preferably 1 to 100 μm. More preferably, the surface roughness (Ra) of the coating film 2 is 3 to 30 μm. An application amount of the coating film 2 is preferably 10 g/m² to 40 g/m² when it is dry so that the irregularities of the base material 1 can appear on the surface of the coating film 2. If the amount is too small, it is difficult to cover the entire surface of the base material 1 completely. Meanwhile, if it is too large, the irregularities of the base material 1 do not appear on the surface of the coating film 2.

Since dimension stability is required in the hot-press sheet 20, in this sense, it is preferable that the surface of the base material 1 is formed of the woven fabric. In view of the dimension stability, strength, and heat resistance especially, it is most preferable that the surface of the base material 1 is formed of the woven fabric comprising inorganic fibers such as glass fibers.

The base material 1 may be a single-layer structure or a laminated-layer structure. When the base material 1 is the laminated-layer structure, layers of the woven fabric, the non-woven fabric, a rubber and the like are appropriately combined, depending on a condition of hot pressing or required characteristics such as a cushion property, heat conductance and the like of the hot-press sheet 20. As the woven fabric or non-woven fabric, a material of heat-resistant fibers such as polyamide, polyester, aromatic polyamide, polyimide and the like is preferable, and as the rubber, a heat-resistant rubber such as a hydrogenated NBR, a fluoro rubber, an EPM, an EPDM and the like is preferably used.

Figure 2:
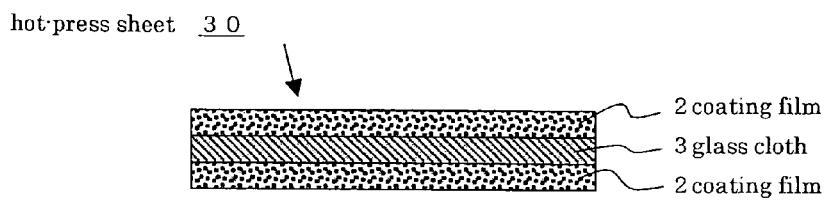
FIG. 2 is a sectional view showing one example of a hot-press sheet according to the present invention.
Figure 3:
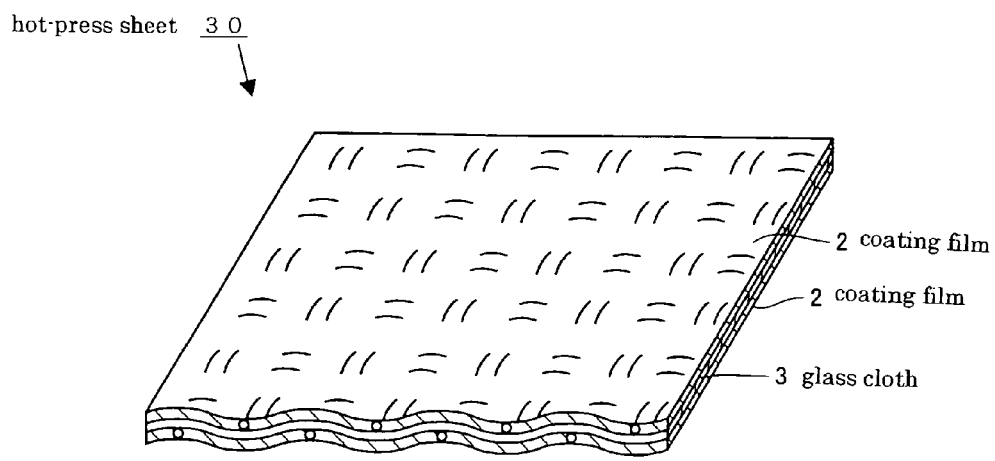
FIG. 3 is a perspective view showing a surface state of the hot-press sheet shown in FIG. 2.

FIG. 2 is a sectional view showing a hot-press sheet 30 in which a base material 1 is a single-layer structure according to one embodiment of the present invention. According to the hot-press sheet 30, a release coating film 2 is formed with an application amount of 25 g/m² on both upper and lower surfaces of a glass cloth 3 having an area weight 200 g/m². FIG. 3 is a perspective view of the hot-press sheet 30 shown in FIG. 2, which shows that irregularities generated by texture of the glass cloth 3 appear over the entire surface of the coating film 2. In this example, surface roughness (Ra) of the glass cloth 3 is 8.7 μm, and surface roughness (Ra) of the coating film 2 is 6.9 μm.

FIGS. 4 to 8 are sectional views showing hot-press sheets in which base materials 1 have laminated-layer structures according to other embodiments of the present invention.

Figure 4:
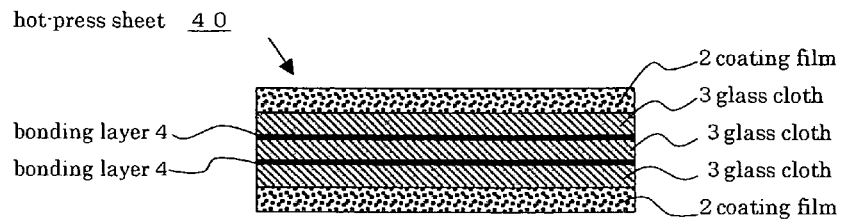
FIG. 4 is a sectional view showing another example of a hot-press sheet according to the present invention.

According to a hot-press sheet 40 shown in FIG. 4, three layers of glass cloth 3 having an area weight 200 g/m² are laminated through bonding layers 4 comprising fluoro rubber, and a release coating film 2 is formed on both upper and lower surfaces of the glass cloth 3.

Figure 5:
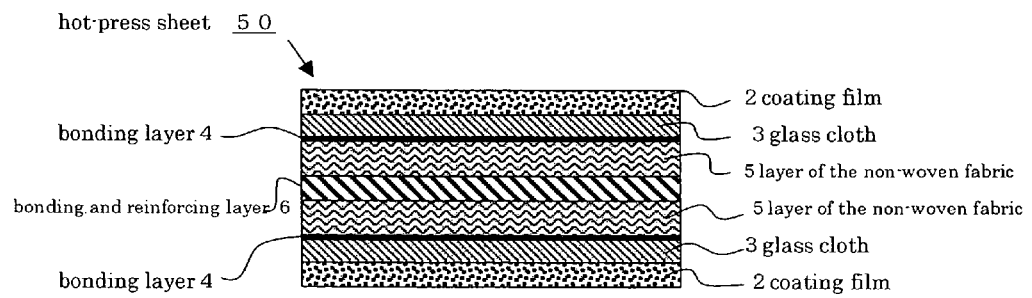
FIG. 5 is a sectional view showing still another example of a hot-press sheet according to the present invention.

According to a hot-press sheet 50 shown in FIG. 5, two layers of non-woven fabric 5 comprising aromatic polyamide and having an area weight 500 g/m² are laminated through a bonding and reinforcing layer 6 comprising a fluoro rubber in which a glass cloth is buried, and glass cloth 3 having an area weight 200 g/m² is laminated on both upper and lower layers of the non-woven fabric layer 5 through bonding layers 4 each comprising a fluoro rubber, and a release coating film 2 is formed on both upper and lower surfaces of the glass cloth 3.

Figure 6:
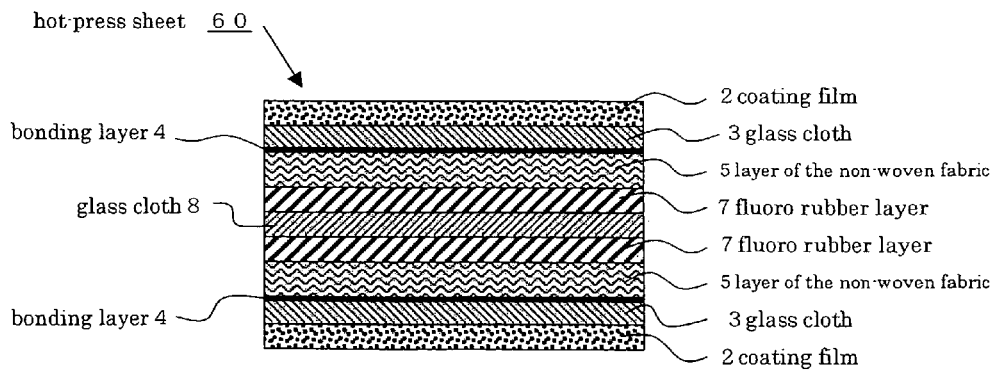
FIG. 6 is a sectional view showing still another example of a hot-press sheet according to the present invention.

According to a hot-press sheet 60 shown in FIG. 6, two layers of fluoro rubber 7 having a thickness 0.5 mm are laminated through a reinforcing glass cloth 8, a non-woven fabric layer 5 comprising aromatic polyamide and having an area weight 500 g/m² is formed on both upper and lower surfaces of the fluoro rubber layer 7, and a glass cloth 3 having an area weight 200 g/m² is formed on both upper and lower surfaces of the non-woven fabric layer 5 through bonding layers 4 each comprising a fluoro rubber, and a release coating film 2 is formed on both upper and lower surfaces of the glass cloth 3.

Figure 7:
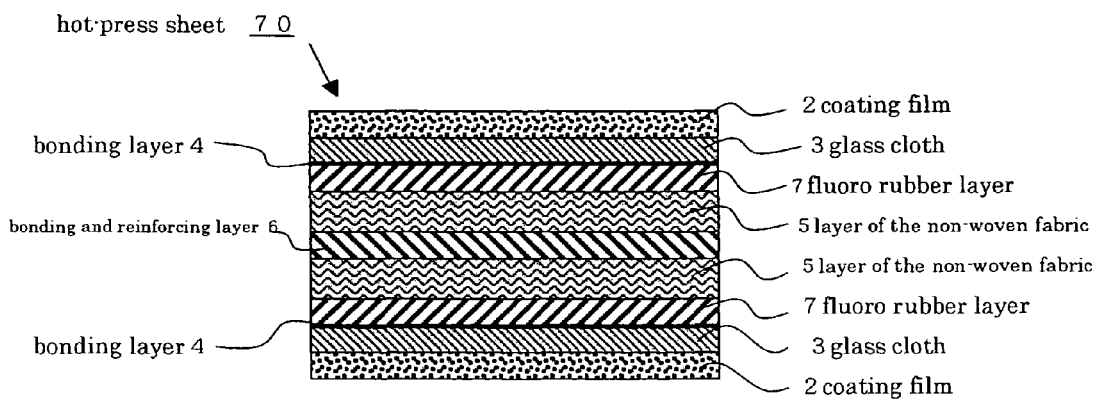
FIG. 7 is a sectional view showing still another example of a hot-press sheet according to the present invention.

According to a hot-press sheet 70 shown in FIG. 7, two layers of non-woven fabric 5 comprising aromatic polyamide and having an area weight 500 g/m² are laminated through a bonding and reinforcing layer 6 comprising a fluoro rubber in which a glass cloth is buried, and a fluoro rubber layer 7 having a thickness 0.5 mm is laminated on both upper and lower surfaces of the non-woven fabric layer 5, and a glass cloth 3 having an area weight 200 g/m² is laminated on both upper and lower surfaces of the fluoro rubber layer 7, and a release coating film 2 is formed on both upper and lower surfaces of the glass cloth 3.

Figure 8:
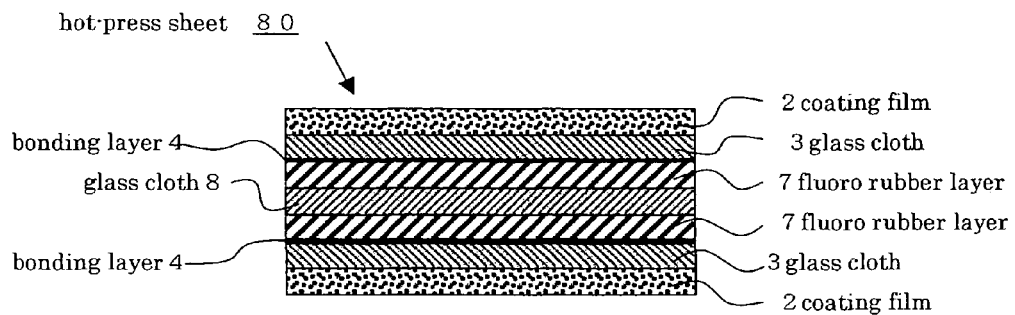
FIG. 8 is a sectional view showing still another example of a hot-press sheet according to the present invention.

According to a hot-press sheet 80 shown in FIG. 8, two layers of fluoro rubber 7 having a thickness 0.5 mm are laminated through a reinforcing glass cloth 8, and a glass cloth 3 having an area weight 200 g/m² is laminated on both upper and lower surfaces of the fluoro rubber layer 7, and a release coating film 2 is formed on both upper and lower surfaces of the glass cloth 3.

The hot-press sheets 30, 40, 50, 60, 70 and 80 shown in FIGS. 2 to 8 can be used as the release sheet 13 or the cushion material 14 in hot pressing shown in FIG. 10 typically. The hot-press sheet 30 shown in FIG. 2 is suitable for being used as the release sheet 13. The hot-press sheet 40 shown in FIG. 4 is suitable for being used as both release sheet 13 and cushion material 14. The hot-press sheets 50, 60, 70 and 80 shown in FIGS. 5 to 8 are suitable for being used as the cushion material 14.

WORKING EXAMPLE

In order to confirm the effect of the present invention, the following comparative experiment was performed.

[Formation of Sample]

Figure 9:
FIG. 9 is a sectional view showing a constitution of a sample used in a comparison experiment.

Samples 1 to 17 of the hot-press sheet were made as will be described below. Each sample was constituted as shown in FIG. 9. As a base material 1, a plain-woven glass cloth having size 200 mm×200 mm and an area weight 200 g/m² was used. According to a coating film 2, as a host material, polyimide resin varnish having solid quantity 25 to 35% (RIKACOAT SN-20 produced by New Japan Chemical Co., Ltd.) was used, and as an organic powder, fluoro resin powder having an average particle diameter 5 μm (LUBLON L-5 produced by DAIKIN INDUSTRIES, LTD.) was used, and as an inorganic powder, titanium oxide powder having an average particle diameter 0.3 to 0.5 μm (JA-3 produced by TAYCA CORPORATION) and zinc oxide powder having an average particle diameter 0.3 to 0.7 μm (produced by SEIDO CHEMICAL INDUSTRIES CO., LTD.) were used. The materials of the coating film 2 were mixed according to a compounding ratio shown in a table 1, applied onto the surface of the base material 1 by knife coating, heated at 160° C. for 3 minutes, and further heated at 220° C. for 3 minutes to form the coating film 2. The application amount of the coating film 2 was decided so that its mass might become 35 g/m² after dried. In addition, the compounding ratio shown in the table 1 is designated by % by weight after the materials are dried.

TABLE 1

|  |  | Sample 1 | Sample 2 | Sample 3 | Sample 4 | Sample 5 | Sample 6 | Sample 7 | Sample 8 | Sample 9 |
|---|---|---|---|---|---|---|---|---|---|---|
| Compounding Ratio | Polyimide | 100 | 75 | 75 | 80 | 75 | 70 | 65 | 65 | 65 |
|  | Fluororesin powder | — | — | 25 | 10 | 10 | 20 | 10 | 25 | 20 |
|  | Titanium oxide powder | — | 25 | — | 10 | 15 | 10 | 25 | 10 | 15 |
|  | Zinc oxide | — | — | — | — | — | — | — | — | — |
| Evaluation | Sink/dent | Generated | Generated | Generated | Generated | Generated | Not generated | Not generated | Not generated | Not generated |
|  | Coating workability | Excellent | Excellent | Excellent | Excellent | Excellent | Excellent | Excellent | Excellent | Excellent |
|  | Abrasion resistance | Excellent | Possible | Excellent | Possible | Possible | Excellent | Possible | Excellent | Excellent |
|  | Release property | Possible | Excellent | Possible | Possible | Excellent | Possible | Excellent | Possible | Excellent |
|  | Flexibility | Excellent | Possible | Excellent | Excellent | Excellent | Excellent | Excellent | Excellent | Excellent |
|  | Total evaluation | No good | No good | No good | No good | No good | Good | Good | Good | Excellent |

|  |  | Sample 10 | Sample 11 | Sample 12 | Sample 13 | Sample 14 | Sample 15 | Sample 16 | Sample 17 |
|---|---|---|---|---|---|---|---|---|---|
| Compounding Ratio | Polyimide | 65 | 60 | 60 | 50 | 40 | 35 | 50 | 50 |
|  | Fluororesin powder | 20 | 15 | 25 | 25 | 35 | 35 | 50 | — |
|  | Titanium oxide powder | — | 25 | 15 | 25 | 25 | 30 | — | 50 |
|  | Zinc oxide | 15 | — | — | — | — | — | — | — |
| Evaluation | Sink/dent | Not generated | Not generated | Not generated | Not generated | Not generated | Not generated | Not generated | Not generated |
|  | Coating workability | Excellent | Excellent | Excellent | Excellent | Possible | No good | Excellent | Excellent |
|  | Abrasion resistance | Excellent | Excellent | Excellent | Excellent | Excellent | Excellent | Excellent | No good |
|  | Release property | Excellent | Excellent | Excellent | Excellent | Excellent | Excellent | No good | Excellent |
|  | Flexibility | Excellent | Excellent | Excellent | Excellent | Excellent | No good | Excellent | No good |
|  | Total evaluation | Excellent | Excellent | Excellent | Excellent | Good | No good | No good | No good |

[Evaluation Method]

Sink/Dent

The sample surface was visually observed to examine whether sinks or dents are generated on the surface or not.

Coating Workability

Excellent: The coating workability was excellent.
Possible: The coating workability was possible.
No good: The coating workability was difficult.

Abrasion Resistance

Mass reduced by abrasion was measured under the condition that sand paper of #800 having a width and a length of ground plane were 40 mm and 50 mm, respectively was used, pressure was 0.004 MPa, a travel distance was 100 mm and the number of to-and-fro rubbings was 20.

Excellent: Reduced mass was less than 0.002 g.
Possible: Reduced mass was not less than 0.002 g and less than 0.003 g.
No good: Reduced mass was not less than 0.003 g.

Release Property

Each sample was put on a stainless mirror-plate having a thickness 1.2 mm, heated at 250° C. for 60 minutes under pressure 6 MPa and then cooled down for 15 minutes under the same pressure. Then, an adhesive state between the sample and the mirror-plate was examined.

Excellent: There was no adhesion.
Possible: There were some adhesion.
No good: There were considerable adhesion and a resin of the coating film peeled off.

Flexibility

A flexibility test was performed under the condition that de Mattia bending testing machine was used, a sample size was 20 mm×150 mm, the number of bending tests is 80,000, and an amplitude distance was 40 mm, and it was examined whether a bend or a break was generated. In regard to samples 1~5, the test was performed at portions in which sinks or dents were not generated.

Excellent: There is no bend.
Possible: The bend was generated but there is no break.
No good: The break was generated.

Total Evaluation

According to the samples 1 to 5 in which the total of mixture ratio of the fluoro resin powder and the titanium oxide powder was less than 30% by weight, since sinks or dents were generated, the problem of the present invention could not be solved. According to the sample 15 in which the total of mixture ratio of the fluoro resin powder and the titanium oxide powder was 65% by weight, there was a problem in the coating workability and the flexibility. According to the sample 16 in which only the fluoro resin was mixed, there was a problem in the release property. According to the sample 17 in which only the titanium oxide powder was mixed, there was a problem in the abrasion resistance and the flexibility.

Meanwhile, according to the samples 6 to 14 in which the total of the mixture of 5 to 55% by weight of the organic powder and 5 to 55% by weight of the inorganic powder was 30 to 60% by weight, since there was no sink or dent, and there was no particular defect in other properties, satisfactory results were provided. Especially, according to the samples 9 to 13 in which 15% or more by weight of the organic powder and 15% or more by weight of the inorganic powder were mixed and the total of the mixture of the organic powder and the inorganic powder was 35 to 50% by weight, and a mixture ratio of the organic powder to the inorganic powder was 3:5 to 5:3, extremely satisfactory results were provided.

Although one embodiment of the present invention was described with reference to the drawings, the present invention is not limited to the above illustrated embodiment. Various modifications may be made within the same or equivalent scope of the present invention.

According to the hot-press sheet of the present invention, since 30% by weight or more of the organic powder and the inorganic powder are mixed in total in the resin composition which forms the coating film, the sinks and the dents are prevented from being generated and the durability is improved. Furthermore, since the mixture ratio of the organic powder is not less than 5% by weight, the mixture ratio of the inorganic powder is not less than 5% by weight and the mixture ratio of the mixture of the organic powder and the inorganic powder is not more than 60% by weight in total, the abrasion resistance, the release property, the flexibility and coating workability of the coating film can be satisfactorily provided.

INDUSTRIAL APPLICABILITY

The present invention can be effectively applied to a hot-press sheet used as a release sheet or a cushion material when an object product is hot pressed or thermally compressed.

The invention claimed is:

1. A hot-press sheet comprising a sheet-shaped base material and a release coating film formed on said base material, wherein said coating film comprises a resin composition in which 5 to 55% by weight of organic powder and 5 to 55% by weight of inorganic powder are mixed in 100% by weight of the resin composition so that the mixture of the organic powder and the inorganic powder becomes 30 to 60% by weight in total, wherein said base material includes a woven fabric, a non-woven fabric, a paper, or a combination thereof.

2. The hot-press sheet according to claim 1, wherein said woven fabric, said non-woven fabric, or said paper includes heat-resistant organic fibers, inorganic fibers, or a combination thereof.

* * * * *